(12) United States Patent
Hsu

(10) Patent No.: US 11,094,919 B2
(45) Date of Patent: Aug. 17, 2021

(54) METHOD OF VACUUM DRYING FILM LAYER AND DISPLAY DEVICE

(71) Applicants: BOE TECHNOLOGY GROUP CO., LTD., Beijing (CN); Hefei Xinsheng Optoelectronics Technology Co., Ltd., Anhui (CN)

(72) Inventor: Minghung Hsu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 500 days.

(21) Appl. No.: 16/303,670

(22) PCT Filed: Mar. 13, 2018

(86) PCT No.: PCT/CN2018/078880
§ 371 (c)(1),
(2) Date: Nov. 21, 2018

(87) PCT Pub. No.: WO2018/210042
PCT Pub. Date: Nov. 22, 2018

(65) Prior Publication Data
US 2021/0226179 A1    Jul. 22, 2021

(30) Foreign Application Priority Data

May 19, 2017    (CN) .......................... 201710361240.8

(51) Int. Cl.
*H01L 29/08*    (2006.01)
*H01L 51/56*    (2006.01)
*H01L 51/50*    (2006.01)

(52) U.S. Cl.
CPC .......... *H01L 51/56* (2013.01); *H01L 51/5012* (2013.01)

(58) Field of Classification Search
CPC combination set(s) only.
See application file for complete search history.

(56) References Cited

U.S. PATENT DOCUMENTS

| 4,510,173 A * | 4/1985 | Higashikawa .... H01L 21/31051 |
| | | 427/503 |
| 7,326,437 B2 * | 2/2008 | Nguyen .................. G03F 7/162 |
| | | 118/320 |

(Continued)

FOREIGN PATENT DOCUMENTS

| CN | 1938878 A | 3/2007 |
| CN | 1971965 A | 5/2007 |

(Continued)

OTHER PUBLICATIONS

First Office Action for Chinese Patent Application No. 201710361240.8 dated Dec. 10, 2018.

(Continued)

*Primary Examiner* — Caleb E Henry
(74) *Attorney, Agent, or Firm* — Calfee, Halter & Griswold LLP

(57) ABSTRACT

The present disclosure provides a method of vacuum drying a film layer and a display device, the method includes: placing a substrate on which a film layer material is formed in a vacuum drying environment, wherein the film layer material contains a solvent and a solute for forming the film layer; in a first stage, evaporating and condensing the solvent in the film layer material on an upper cover plate, wherein the film layer material still contains an amount of solvent to form a soft film having fluidity; in a second stage, re-condensing a portion of the solvent condensed on the upper cover plate onto the substrate to increase the fluidity of the (Continued)

soft film on the substrate; and repeating the first stage and the second stage, vacuuming to completely evaporate the solvent and cure the film layer after forming a substantially flat film layer.

20 Claims, 2 Drawing Sheets

(56) References Cited

U.S. PATENT DOCUMENTS

| | | |
|---|---|---|
| 2012/0047764 A1 | 3/2012 | Campion et al. |
| 2014/0290090 A1 | 10/2014 | Campion et al. |
| 2015/0031808 A1* | 1/2015 | Huang .................. G03F 7/0233 524/159 |
| 2015/0179987 A1* | 6/2015 | Ma ...................... H01L 51/5275 257/40 |
| 2016/0336189 A1* | 11/2016 | Kori ........................ G03F 7/094 |
| 2017/0327693 A1* | 11/2017 | Shipman .................. C09D 7/63 |
| 2018/0187306 A1* | 7/2018 | Ahlf ........................ B05D 1/60 |

FOREIGN PATENT DOCUMENTS

| | | |
|---|---|---|
| CN | 107201504 A | 9/2017 |
| JP | H07043066 A | 2/1995 |
| JP | 2009288383 A | 12/2009 |
| KR | 101355214 B1 | 1/2014 |
| KR | 20140003811 A | 1/2014 |
| WO | 2012027205 A1 | 3/2012 |
| WO | 2015138145 A1 | 9/2015 |

OTHER PUBLICATIONS

Search Report and Written Opinion for International Application No. PCT/CN2018/078880 dated Jun. 8, 2018.

* cited by examiner

METHOD OF VACUUM DRYING FILM LAYER AND DISPLAY DEVICE

CROSS REFERENCE

The present application is based upon International Application No. PCT/CN2018/078880, filed on Mar. 13, 2018, which is based upon and claims priority to Chinese Patent Application No. 201710361240.8, filed on May 19, 2017, and the entire contents thereof are incorporated herein by reference.

TECHNICAL FIELD

The present disclosure relates to the field of display technology, and more particularly to a method of vacuum drying a film layer and a display device.

BACKGROUND

The organic light-emitting diode (OLED) has the characteristics of high material utilization, high efficiency or the like, and has features that it do not require fine metal masks (FMM) or other complicated patterning processes or the like when applied to displays, and has the advantage of being easy to prepare for large areas and full-color displays or the like The organic light-emitting diode has broad application prospects, has attracted widespread attention, and is especially suitable for applications of large-sized displays.

It should be noted that the information disclosed in the background section above is only for enhancing the understanding of the background of the present disclosure, and thus may include information that does not constitute prior art known to those of ordinary skill in the art.

SUMMARY

The present disclosure provides a method of vacuum drying a film layer and a display device.

According to an embodiment of the present disclosure, a method of vacuum drying a film layer is provided, the method comprising: placing a substrate on which a film layer material is formed in a vacuum drying environment, wherein the film layer material contains a solvent and a solute for forming the film layer; in a first stage, evaporating and condensing the solvent in the film layer material on an upper cover plate, wherein the film layer material still contains an amount of solvent to form a soft film having fluidity; in a second stage, re-condensing a portion of the solvent condensed on the upper cover plate onto the substrate to increase the fluidity of the soft film on the substrate; and repeating the first stage and the second stage, vacuuming to completely evaporate the solvent and cure the film layer after forming a substantially flat film layer.

In one embodiment of the present disclosure, a temperature control plate capable of controlling a temperature of the substrate is provided, and the temperature control plate enables the temperature of the substrate to be lowered in the second stage.

In one embodiment of the present disclosure, a vacuum degree of the vacuum drying environment is set in the first stage to cause the solvent in the film layer material to evaporate and condense on the upper cover plate.

In one embodiment of the present disclosure, in the second stage, an uneven region of the soft film becomes flatter by flowing.

In one embodiment of the present disclosure, a temperature of the upper cover plate is adjustable, wherein the temperature of the upper cover plate is lowered in the first stage and the temperature of the upper cover plate is raised in the second stage.

In one embodiment of the present disclosure, the upper cover plate has an independent solvent supply system to form an independent solvent condensate tank.

In one embodiment of the present disclosure, the film layer material is formed on the substrate by ink-jet printing.

In an embodiment of the present disclosure, in the first stage, a temperature difference is formed between the upper cover plate and the substrate, thereby forming a process in which the solvent condenses toward the upper cover plate, and in the second stage, a reverse temperature difference is formed between the upper cover plate and the substrate, thereby forming a process in which the solvent condensed on the upper cover plate condenses toward the substrate.

In one embodiment of the present disclosure, the film layer is an organic light emitting layer.

According to another embodiment of the present disclosure, a display device is provided, the display device comprising a film layer prepared according to the method described above.

According to another embodiment of the present invention, a method of forming a film layer is provided, comprising: forming a layer comprising a film layer material on a substrate, the film layer material comprising a solvent and a solute for forming the film layer; in a first stage, performing an evaporation on the film layer material to remove part of the solvent to form a soft film having fluidity; in a second stage, adding the solvent to the soft film to increase the fluidity of the soft film; in a third stage, performing a full evaporation on the soft film to remove the solvent and cure the film.

In one embodiment of the present disclosure, the first stage and the second stage are repeated at least once before the third stage.

In an embodiment of the present disclosure, performing an evaporation on the film layer material to remove part of the solvent further comprises: condensing evaporated solvent on an opposite substrate.

In one embodiment of the present disclosure, a temperature of the opposite substrate is lowered during the step of condensing evaporated solvent on an opposite substrate.

In an embodiment of the present disclosure, the step of adding the solvent to the soft film further comprises: adding the solvent condensed on the opposite substrate to the soft film.

In an embodiment of the present disclosure, the step of adding the solvent condensed on the opposite substrate to the soft film comprises: heating the opposite substrate to evaporate the solvent condensed on the opposite substrate; and condensing the solvent evaporated from the opposite substrate into the soft film.

In one embodiment of the present disclosure, a temperature of the substrate is lowered during the step of condensing the solvent evaporated from the opposite substrate into the soft film.

In one embodiment of the present disclosure, the method is performed in a vacuum drying environment.

In one embodiment of the present disclosure, the film layer is an organic light emitting layer.

According to another embodiment of the present invention, a display device is provided, the display device comprising a film layer prepared according to the method described above.

It should be understood that the above general description and the following detailed description are merely exemplary and explanatory, and are not limiting of the present disclosure.

This section provides an overview of various implementations or examples of the techniques described in the present disclosure, and is not a comprehensive disclosure of the full scope or all features of the disclosed technology.

BRIEF DESCRIPTION OF THE DRAWINGS

The accompanying drawings are included to provide a further understanding of the present disclosure, which is incorporated into the present application and forms part of the present application, and are used to explain the principle of the disclosure together with the description. In the drawing.

DETAILED DESCRIPTION

Figure 1:
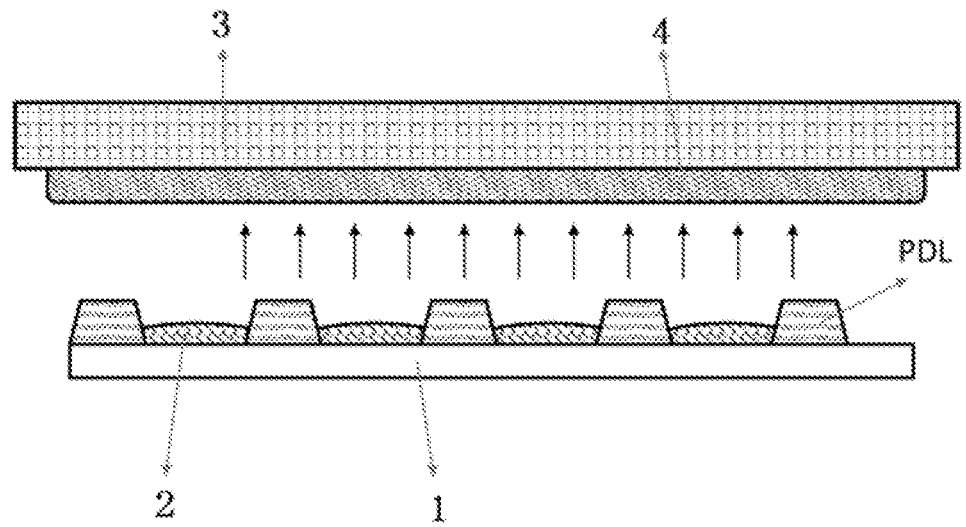
FIG. 1 is a schematic view illustrating a process of drying a film layer of a display device in a comparison example.

It should be understood that when an element or a layer is referred to as being "on" or "connected" to another element or layer, the element or the layer can be directly on another element or layer, directly connected or directly bonded to another element or layer, or an intermediate element or intermediate layer may be present. Conversely, when an element is referred to as being "directly on" or "directly connected" to another element or layer, there is no intermediate element or intermediate layer. The same reference numerals always refer to the same elements.

For convenience of description, spatially relative terms such as "under", "above", "upper", "below", etc., may be used herein to describe the relationship of one element or feature to other elements or features as illustrated in the figures. It will be understood that spatially relative terms are intended to include different orientations of the device in use or operation in addition to the orientations described in the drawings.

As used herein, unless the context clearly states, otherwise the singular forms "a" and "the" are also intended to include the plural. It will also be understood that when the terms "comprising" and/or "including" are used in the specification, it indicates that the described features, integers, steps, operations, components and/or components are present, but do not exclude the presence or addition of one or more other features, integers, steps, operations, components, components and/or groups thereof.

In general, a method of vacuum drying a film layer of a display device according to an embodiment of the present disclosure includes the following steps: placing a substrate on which a film layer material (such as a solution material) is formed in a vacuum drying environment, wherein the film layer material contains a solvent and a solute for forming a film layer; in a first stage, evaporating and condensing a solvent in the film layer material on the upper cover plate, wherein the film layer material still contains an amount of solvent to form a soft film having a relatively low fluidity; in the second stage, re-condensing a portion of the solvent condensed on the upper cover plate onto the substrate to increase the fluidity of the soft film on the substrate; and repeating the first stage and the second stage, vacuuming to completely evaporate the solvent and cure the film after forming a substantially flat film layer.

In one embodiment, a temperature control plate capable of controlling a temperature of the substrate may be provided, and the temperature control plate enables the temperature of the substrate to be lowered in the second stage.

The vacuum degree of the vacuum drying environment is set in the first stage so that an amount of solvent in the film layer material evaporates and condenses on the upper cover plate and maintains the film layer material still having relatively low fluidity.

In the second stage, since a part of the solvent on the upper cover plate is re-condensed onto the substrate, thereby increasing the fluidity of the soft film on the substrate, the uneven region of the soft film becomes flatter by flowing.

In one embodiment, the temperature of the upper cover plate is adjustable, wherein the temperature of the upper cover plate is lowered in the first stage to condense the evaporated solvent on the upper cover plate and the temperature of the upper cover plate is raised in the second stage to re-condense the solvent condensed on the upper cover plate onto the substrate.

In one embodiment, the upper cover plate may have an independent solvent supply system to form an independent solvent condensate tank.

In the first stage, a temperature difference is formed between the upper cover plate and the substrate, thereby forming a process in which the solvent condenses toward the upper cover plate, in the second stage, a reverse temperature difference is formed between the upper cover plate and the substrate, thereby forming a process in which the solvent condensed on the upper cover plate condenses toward the substrate.

In one embodiment, the film layer may be an organic light emitting layer, but it is not limited thereto.

Exemplary embodiments of the present disclosure will be explained in detail below with reference to the accompanying drawings.

FIG. 1 is a schematic view illustrating a process of drying a film layer of a display device in a comparison example.

First, the ink-jet printing substrate 1 is transferred to a sealed environment (referred to herein as a vacuum drying chamber (VCD)) isolated from the outside atmosphere. A pixel defining layer PDL and an ink solution 2 (i.e., may be referred to as a film layer material or a solution material) coated in the gaps in the pixel defining layer PDL by ink-jet printing are disposed on the substrate 1, the ink solution 2 containing organic molecules capable of forming a film layer of the display device as a solute and an organic solvent. The amount of the coated ink solution 2 is determined according to the requirements for the film thickness of the final film formation, and keeps a certain volume as much as possible.

The substrate 1 enters the vacuum drying chamber, and then the pressure in the chamber is gradually lowered by a pre-designed multi-stage pumping to evaporate the solvent. During the evaporation process, the solvent gradually decreases, and the concentration of the ink solution 2 on the substrate 1 increases, which is affected by the evaporation rate of the solvent in each region, and is therefore also affected by the solvent vapor pressure above the region. In order to make the evaporation rate of the solvent in each region relatively uniform, the upper cover plate 3 may be disposed above the substrate 1 in the vacuum drying chamber, and a suitable condensing device may be provided. During the process of vacuum drying, the condensing device maintains the proper temperature to have a fixed temperature difference from the substrate. Since the solvent condenses on the upper cover plate 3, the process ensures that the solvent vapor has a relatively uniform distribution from the bottom to the top. Further, a solvent tank 4 may be provided on the upper cover plate 3, so that the evaporated solvent will be collected in the solvent tank 4.

Figure 2:
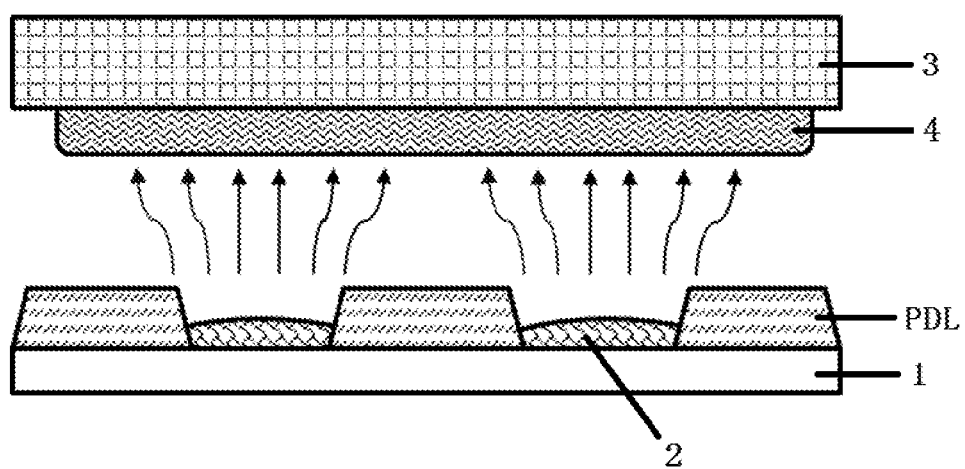
FIG. 2 is an enlarged schematic view illustrating a partial region of a periphery of a pixel formed in a comparison example.

FIG. 2 is an enlarged schematic view illustrating a partial region of a periphery of a pixel formed in a comparison example. Although the solvent vapor has a relatively uniform distribution from the bottom to the top in the comparison example, the solvent vapor has only a single process of condensation towards the upper cover plate from the bottom to the top. Further, as shown in FIG. 2, since the uncoated solution exists in a partial region around the pixel, the solvent vapor distribution is affected, and the solution in the peripheral region of the pixel has a phenomenon in which the film thickness is uneven.

Figure 3:
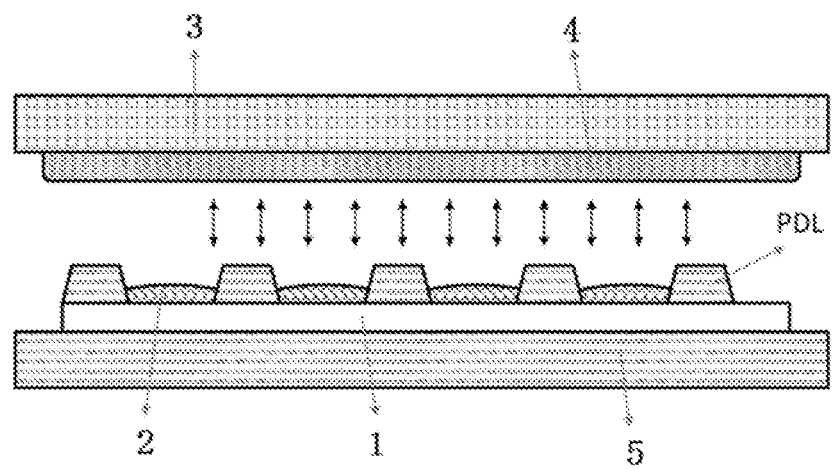
FIG. 3 is a schematic view illustrating a method of vacuum drying a film layer of a display device according to an embodiment of the present disclosure.
Figure 4:
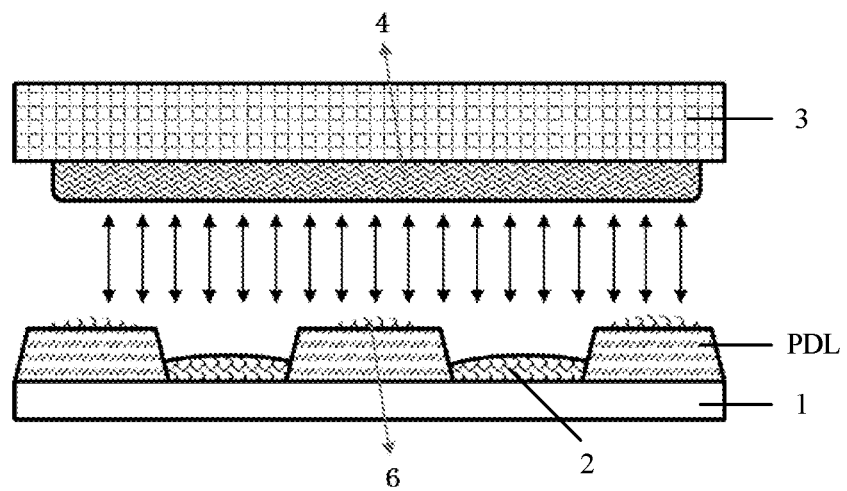
FIG. 4 is a schematic view illustrating a method of vacuum drying a film layer of a display device according to an embodiment of the present disclosure.

FIG. 3 and FIG. 4 are schematic views illustrating a method of vacuum drying a film layer of a display device according to an embodiment of the present disclosure.

Different from the comparison example, in the embodiment of the present disclosure, the process of vacuum drying the film layer of the display device is performed in a multi-stage manner.

In one embodiment, referring to FIG. 3, a substrate 1 having a film layer material (such as a solution material) 2 formed thereon is first placed in a vacuum drying environment, wherein the film layer material 2 contains a solvent and a solute for forming a film layer. Then, in the first stage, most of the solvent in the film layer material 2 (i.e., more than half of the solvent of the total solvent) is evaporated and condensed on the upper cover plate 3, wherein the film layer material 2 still contains an amount of solvent. (i.e., less than half of the total solvent) to form a soft film having relatively low fluidity.

Then, a part of the solvent condensed on the upper cover plate 3 is re-condensed onto the substrate 1 in the second stage, so that the fluidity of the soft film on the substrate 1 is increased. In the second stage, uneven regions of the soft film becomes flatter by flowing. Then, the first stage and the second stage can be repeated, and vacuum to completely evaporate the solvent and cure the film after forming a substantially flat film layer.

As shown in FIG. 3, a solvent tank 4 may be provided on the upper cover plate 3 so that the evaporated solvent is collected in the solvent tank 4.

In another embodiment, the temperature of the upper cover plate 3 is adjustable, wherein the temperature of the upper cover plate 3 is lowered in the first stage and the temperature of the upper cover plate 3 is raised in the second stage. This can be achieved by adding a temperature-controlled temperature control plate on the upper cover plate 3, which of course can also be achieved by other means.

In one embodiment, instead of solvent tank 4, the upper cover plate 3 may have an independent solvent supply system to form an independent solvent condensate tank (which may also be designated by the numeral "4"). That is, the solvent is stored in the solvent condensing tank 4 for condensation downward onto the substrate 1, thereby increasing the fluidity of the soft film on the substrate 1. The solvent stored in the solvent condensing tank 4 may be the same as or different from the solvent of the ink solution, and may include one or more of the following solvents: aromatic hydrocarbons (such as benzene, toluene, xylene, etc.); aliphatic hydrocarbons (such as pentane, hexane, octane, etc.); alicyclic hydrocarbons (such as cyclohexane, cyclohexanone, toluene cyclohexanone, etc.); halogenated hydrocarbons (such as chlorobenzene, dichlorobenzene, dichloromethane, etc.); alcohols (such as methanol, ethanol, isopropanol, etc.); ethers (such as ether, propylene oxide, etc.); esters (such as methyl acetate, ethyl acetate, propyl acetate, etc.); ketones (such as acetone, methyl butanone, methyl isobutyl ketone, etc.; diol derivatives (such as ethylene glycol monomethyl ether, ethylene glycol monoethyl ether, ethylene glycol monobutyl ether, etc.); and other solvents (such as acetonitrile, pyridine, phenol, etc.)). Those skilled in the art can select an appropriate solvent to store in the solvent condensing tank 4 or replenish the solvent in the solvent condensing tank 4 according to actual needs.

In one embodiment, a temperature control plate 5 capable of controlling a temperature of the substrate 1 is provided, and the temperature control plate 5 is enables the temperature of the substrate 1 to be lowered in the second stage.

In the embodiment of the present disclosure, the first stage of vacuum evaporation is substantially the same as the conventional method, but a vacuum environment having a certain vacuum degree is required to evaporate most of the solvent (more than half of the solvent) onto the upper cover plate 3, however, a small amount of solvent (half or less of the solvent) will remain on the substrate 1, and the film layer obtained at this stage is a soft film having a low fluidity, and the entire film is not completely cured. In the second stage, the temperature control plate 5 on the substrate 1 can be selectively activated to cool the substrate 1, so that the entire condensation process is reversed. At this time, the solvent on the upper cover plate 3 is condensed toward the substrate 1, and a thin liquid layer is formed both in the pixel region and outside the pixel. In this case, the fluidity of the soft film of the pixel region is increased, so that the uneven region is reflowed and leveled. In addition, controlling this process does not last too long to avoid a large amount of solvent condensing on the substrate 1 and causing a change in the solute distribution. Then, the process of the first stage can be repeated. In addition, in the second stage, a very small amount of solvent remains outside the pixel region, thus contributing the solution vapor in the first stage of the repetition, so the vapor distribution around the pixel during this process is more uniform than in the first stage, as shown in FIG. 4.

The first stage and the second stage may be repeated several times, and then the chamber may be under vacuum to completely evaporate the solvent and cure the film after forming a substantially flat film layer. Through the first stage and the second stage, the solvent vapor responds in a substantially one-dimensional direction due to the temperature difference, thereby "flattening" the solute distribution in the uneven region. Specifically, in the first stage, a temperature difference is formed between the upper cover plate 3 and the substrate 1, thereby forming a process in which the solvent condenses toward the upper cover plate 3, and in the second stage, a reverse temperature difference is formed between the upper cover plate 3 and the substrate 1, thereby forming a process in which the solvent condensed on the upper cover plate 3 condenses toward the substrate 1.

In the final stage, the vacuum degree can be pumped to a certain low point to allow the solvent to completely evaporate and the film to cure. The subsequent processes are the same as the conventional one.

In an embodiment of the present disclosure, the film layer to be formed may be an organic light emitting layer, but the present disclosure is not limited thereto, and the film layer to be formed may be any suitable film layer that can be formed on the substrate by ink-jet printing.

For example, after forming a common hole injection layer (HIL) and a hole transport layer (HTL), an RGB light-emitting layer (which can be formed by the method of the present disclosure) can be formed by ink-jet printing, and finally, an injection modification layer is formed by thermal evaporation and a transparent oxide (for example, IZO) is formed by sputtering as an upper electrode, thereby forming a full-color display device.

In addition, the upper electrode of the display device may adopt a thin metal electrode (for example, magnesium, silver, or magnesium-silver alloy, etc.) fabricated by thermal evaporation, and a transparent semiconductor or conductor may be plated on the thin metal electrode according to actual needs.

By adopting the technical solution of the embodiments of the present disclosure, the problem of poor uniformity of film thickness in pixels caused by uneven distribution of solvent vapor in the process of drying film formation of printed OLED film layer can be solved.

In the foregoing embodiments of the present disclosure, the process of achieving a flat film layer by repeatedly transferring the solvent between the film layer and the upper cover plate by heating and condensation is specifically described. However, it should be understood by those skilled in the art that the present invention is not limited to the specific implementations described above. For example, in addition to evaporation and condensation, the solvent evaporated in the film layer can be transferred back to the film layer by other means. For example, an electrostatic force, a mechanical force, or the like may be used to transfer the evaporated solvent back to the film layer, or in other embodiments, a new solvent may be supplemented by inkjet or the like, and the present disclosure is not limited thereto.

In summary, an embodiment of the present invention provides a method of forming a film layer, comprising:
  forming a layer comprising a film layer material on the substrate, the film layer material comprising a solvent and a solute for forming the film layer;
  performing an evaporation on layer material in a first stage to remove a portion of the solvent to form a soft film having fluidity;
  adding a solvent to the soft film in the second stage to increase the fluidity of the soft film;
  performing full evaporation on the soft film in the third stage to remove the solvent and cure the film.

In one embodiment of the present disclosure, the first stage and the second stage are repeated at least once before the third stage.

In an embodiment of the present disclosure, performing an evaporation on the film layer material to remove a portion of the solvent further comprises:
  Condensing the evaporated solvent on the opposite substrate.

In one embodiment of the present disclosure, the temperature of the opposite substrate is lowered during the process of condensing the evaporated solvent on the opposite substrate.

In an embodiment of the present disclosure, adding the solvent to the soft film further comprises:
  adding a solvent condensed on the opposite substrate to the soft film.

In an embodiment of the present disclosure, adding the solvent condensed on the opposite substrate to the soft film comprises:
  heating the opposite substrate to evaporate the solvent condensed on the opposite substrate;
  condensing the solvent evaporated from the opposite substrate into the soft film.

In one embodiment of the present disclosure, the temperature of the substrate is lowered during the process of condensing the solvent evaporated from the opposite substrate into the soft film.

In one embodiment of the present disclosure, the method is performed in a vacuum drying environment.

In one embodiment of the present disclosure, the film layer is an organic light emitting layer.

By adopting the technical solution of the embodiment of the present disclosure, the problem of poor uniformity of film thickness in pixels caused by uneven distribution of solvent vapor in the process of drying film formation of the display device can be solved.

The foregoing description of the specific exemplary embodiments of the present disclosure has been presented in the drawings. The exemplary embodiments are not intended to be exhaustive or to limit the present disclosure to the precise forms disclosed, and it is apparent that many modifications and variations can be made by those skilled in the art under the guidance of the above teachings. Therefore, the scope of the present disclosure is not intended to be limited to the foregoing embodiments, but is intended to be defined by the claims and their equivalents.

What is claimed is:

1. A method of vacuum drying a film layer, the method comprising:
  placing a substrate on which a film layer material is formed in a vacuum drying environment, wherein the film layer material contains a solvent and a solute for forming the film layer;
  in a first stage, evaporating and condensing the solvent in the film layer material on an upper cover plate, wherein the film layer material still contains an amount of solvent to form a soft film having fluidity;
  in a second stage, re-condensing a portion of the solvent condensed on the upper cover plate onto the substrate to increase the fluidity of the soft film on the substrate; and
  repeating the first stage and the second stage, vacuuming to completely evaporate the solvent and cure the film layer after forming a substantially flat film layer.

2. The method according to claim 1, wherein a temperature control plate capable of controlling a temperature of the substrate is provided, and the temperature control plate enables the temperature of the substrate to be lowered in the second stage.

3. The method according to claim 1, wherein a degree of a vacuum in the vacuum drying environment is set in the first stage to cause the solvent in the film layer material to evaporate and condense on the upper cover plate.

4. The method according to claim 1, wherein in the second stage, an uneven region of the soft film becomes flatter by flowing.

5. The method according to claim 1, wherein a temperature of the upper cover plate is adjustable, and wherein temperature of the upper cover plate is lowered in the first stage and the temperature of the upper cover plate is raised in the second stage.

6. The method according to claim 1, wherein the upper cover plate has an independent solvent supply system to form an independent solvent condensate.

7. The method according to claim 1, wherein the film layer material is formed on the substrate by ink-jet printing.

8. The method according to claim 1, wherein in the first stage, a temperature difference is formed between the upper cover plate and the substrate, thereby forming a process in which the solvent condenses toward the upper cover plate, and in the second stage, a reverse temperature difference is formed between the upper cover plate and the substrate, thereby forming a process in which the solvent condensed on the upper cover plate condenses toward the substrate.

9. The method according to claim 1, wherein the film layer is an organic light emitting layer.

10. A display device comprising a film layer prepared according to the method of claim 1.

11. A method of forming a film layer, comprising:
   forming a layer comprising a film layer material on a substrate, the film layer material comprising a solvent and a solute for forming the film layer;
   in a first stage, performing an evaporation on the film layer material to remove a portion of the solvent to form a soft film having fluidity;
   in a second stage, adding the solvent to the soft film to increase the fluidity of the soft film; and
   in a third stage, performing a full evaporation on the soft film to remove the solvent and cure the film.

12. The method according to claim 11, wherein the first stage and the second stage are repeated at least once before the third stage.

13. The method according to claim 11, wherein the step of performing an evaporation on the film layer material to remove a portion of the solvent further comprises:
   condensing evaporated solvent on an opposite substrate.

14. The method according to claim 13, further comprising, lowering a temperature of the opposite substrate during the step of condensing evaporated solvent on an opposite substrate.

15. The method according to claim 13, wherein the step of adding the solvent to the soft film further comprises:
   adding the solvent condensed on the opposite substrate to the soft film.

16. The method according to claim 15, wherein the adding the solvent condensed on the opposite substrate to the soft film comprises:
   heating the opposite substrate to evaporate the solvent condensed on the opposite substrate; and
   condensing the solvent evaporated from the opposite substrate into the soft film.

17. The method according to claim 16, further comprising, lowering a temperature of the substrate during the step of condensing the solvent evaporated from the opposite substrate into the soft film.

18. The method according to claim 11, wherein the method is performed in a vacuum drying environment.

19. The method according to claim 11, wherein the film layer is an organic light emitting layer.

20. A display device comprising a film layer prepared according to the method of claim 11.

* * * * *